United States Patent
Lu et al.

(10) Patent No.: US 12,527,196 B2
(45) Date of Patent: Jan. 13, 2026

(54) DISPLAY PANEL, FORMING METHOD THEREOF AND DISPLAY DEVICE

(71) Applicant: Xiamen Tianma Display Technology Co., Ltd., Xiamen (CN)

(72) Inventors: Lijun Lu, Xiamen (CN); Huangyao Wu, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 381 days.

(21) Appl. No.: 18/130,533

(22) Filed: Apr. 4, 2023

(65) Prior Publication Data

US 2024/0206273 A1   Jun. 20, 2024

(30) Foreign Application Priority Data

Dec. 16, 2022   (CN) .......................... 202211623076.0

(51) Int. Cl.
| | |
|---|---|
| *H10K 59/38* | (2023.01) |
| *H10K 59/12* | (2023.01) |
| *H10K 59/122* | (2023.01) |
| *H10K 59/80* | (2023.01) |
| *H10K 71/00* | (2023.01) |
| *H10K 102/00* | (2023.01) |

(52) U.S. Cl.
CPC ......... *H10K 59/38* (2023.02); *H10K 59/1201* (2023.02); *H10K 59/122* (2023.02); *H10K 59/873* (2023.02); *H10K 59/8792* (2023.02); *H10K 71/00* (2023.02); *H10K 2102/351* (2023.02)

(58) Field of Classification Search
CPC .......................... H10K 59/38; G02F 1/133514
See application file for complete search history.

(56) References Cited

U.S. PATENT DOCUMENTS

| | | | | |
|---|---|---|---|---|
| 2012/0287523 | A1* | 11/2012 | Wu | ........................ G02B 5/201 430/7 |
| 2018/0159080 | A1* | 6/2018 | Shimoyama | ..... H10K 59/80521 |
| 2020/0388653 | A1* | 12/2020 | Lee | ....................... G09G 3/3225 |

FOREIGN PATENT DOCUMENTS

CN             115274786 A   * 11/2022

* cited by examiner

*Primary Examiner* — Alia Sabur
(74) *Attorney, Agent, or Firm* — Anova Law Group, PLLC

(57) ABSTRACT

Display panel, forming method, and display device are provided. The display panel includes: an array substrate, including a plurality of open areas and non-open areas between adjacent open areas; a display array on a side of the array substrate, the display array at least including a first light-emitting element, a second light-emitting element, and a third light-emitting element with different light-emitting colors, and the first light-emitting element, the second light-emitting element and the third light-emitting element being respectively in corresponding opening areas; an encapsulation layer covering the display array; a touch electrode layer on a side of the encapsulation layer away from the array substrate; a first planarization layer covering the touch electrode layer; and a color-resist structure on a side of the first planarization layer away from the display array. The color-resist structure includes a first color-resist layer, a second color-resist layer and a third color-resist layer.

14 Claims, 9 Drawing Sheets

DISPLAY PANEL, FORMING METHOD THEREOF AND DISPLAY DEVICE

CROSS-REFERENCE TO RELATED APPLICATION

This application claims priority of Chinese Patent Application No. 202211623076.0, filed on Dec. 16, 2022, the entire content of which are hereby incorporated by reference.

FIELD OF THE DISCLOSURE

The present disclosure generally relates to the field of antenna technology and, more particularly, relates to a display panel, a forming method thereof, and a display device.

BACKGROUND

With a continuous advancement of science and technology, more and more display devices are widely used in people's daily life and work, which bring great conveniences to people's daily life and work and have become indispensable and important tools for people today.

A main component of a display device to realize a display function is a display panel. The display panel includes a display array with a plurality of light-emitting elements for image display. A patterned black matrix is arranged on a light-emitting side of the display array. Areas corresponding to the light-emitting elements of the black matrix has hollow areas for arranging color-resist units which can transmit the light of the corresponding light-emitting element and block the light of other colors.

In an existing display panel, the black matrix is generally arranged on a surface of a planarization layer. Since the black matrix and the planarization layer are made of different materials and properties of the two materials are different, there is a problem of dispersion compatibility between the black matrix and the planarization layer, which leads to swelling, warping or even separation is likely to occur at an interface between the black matrix and the planarization layer, which affects an image display quality and a service life of the display panel.

BRIEF SUMMARY OF THE DISCLOSURE

One aspect of the present disclosure provides a display panel. The display panel includes: an array substrate, including a plurality of open areas and non-open areas between adjacent open areas; a display array on a side of the array substrate, the display array at least including a first light-emitting element, a second light-emitting element, and a third light-emitting element with different light-emitting colors, and the first light-emitting element, the second light-emitting element and the third light-emitting element being respectively in corresponding opening areas; an encapsulation layer covering the display array; a touch electrode layer on a side of the encapsulation layer away from the array substrate; a first planarization layer covering the touch electrode layer; and a color-resist structure on a side of the first planarization layer away from the display array. The color-resist structure includes a first color-resist layer, a second color-resist layer and a third color-resist layer. The first color-resist layer includes a first color-resist unit and a first block, in a direction perpendicular to a plane where the array substrate is located, the first color-resist unit at least partially overlaps the first light-emitting element, and the first block at least partially overlaps the non-opening area. The second color-resist layer includes a second color-resist unit and a second block, in the direction perpendicular to the plane where the array substrate is located, the second color-resist unit at least partially overlaps the second light-emitting element, and the second block at least partially overlaps the non-opening area. The third color-resist layer includes a third color-resist unit and a third block, in the direction perpendicular to the plane where the array substrate is located, the third color-resist unit at least partially overlaps the third light-emitting element, and the third block at least partially overlaps the non-opening area. At least two of the first block, the second block and the third block are stacked along the direction perpendicular to the plane where the array substrate is located to form a light-shielding structure.

Another aspect of the present disclosure provides a display device. The display device includes a display panel. The display panel includes: an array substrate, including a plurality of open areas and non-open areas between adjacent open areas; a display array on a side of the array substrate, the display array at least including a first light-emitting element, a second light-emitting element, and a third light-emitting element with different light-emitting colors, and the first light-emitting element, the second light-emitting element and the third light-emitting element being respectively in corresponding opening areas; an encapsulation layer covering the display array; a touch electrode layer on a side of the encapsulation layer away from the array substrate; a first planarization layer covering the touch electrode layer; and a color-resist structure on a side of the first planarization layer away from the display array. The color-resist structure includes a first color-resist layer, a second color-resist layer and a third color-resist layer. The first color-resist layer includes a first color-resist unit and a first block, in a direction perpendicular to a plane where the array substrate is located, the first color-resist unit at least partially overlaps the first light-emitting element, and the first block at least partially overlaps the non-opening area. The second color-resist layer includes a second color-resist unit and a second block, in the direction perpendicular to the plane where the array substrate is located, the second color-resist unit at least partially overlaps the second light-emitting element, and the second block at least partially overlaps the non-opening area. The third color-resist layer includes a third color-resist unit and a third block, in the direction perpendicular to the plane where the array substrate is located, the third color-resist unit at least partially overlaps the third light-emitting element, and the third block at least partially overlaps the non-opening area. At least two of the first block, the second block and the third block are stacked along the direction perpendicular to the plane where the array substrate is located to form a light-shielding structure.

Another aspect of the present disclosure provides a forming method of a display panel. The method includes providing an array substrate including a plurality of opening areas and non-opening areas between adjacent opening areas; forming a display array on a side of the array substrate, the display array at least including a first light-emitting element, a second light-emitting element, and a third light-emitting element with different light-emitting colors, the first light-emitting element, the second light-emitting element, and the third light-emitting element being respectively in corresponding opening areas; sequentially forming an encapsulation layer covering the display array, a touch electrode layer, and a first planarization layer covering the touch electrode layer on a side of the display array away from the array substrate; and forming a color-resist structure on a side of the first planarization layer away from the display array. The color-resist structure includes a first color-resist layer, a second color-resist layer and a third color-resist layer. The first color-resist layer includes a first color-resist unit and a first block, in a direction perpendicular to a plane where the array substrate is located, the first color-resist unit at least partially overlaps the first light-emitting element, and the first block at least partially overlaps the non-opening area. The second color-resist layer includes a second color-resist unit and a second block, in the direction perpendicular to the plane where the array substrate is located, the second color-resist unit at least partially overlaps the second light-emitting element, and the second block at least partially overlaps the non-opening area. The third color-resist layer includes a third color-resist unit and a third block, in the direction perpendicular to the plane where the array substrate is located, the third color-resist unit at least partially overlaps the third light-emitting element, and the third block at least partially overlaps the non-opening area. At least two of the first block, the second block and the third block are stacked along the direction perpendicular to the plane where the array substrate is located to form a light-shielding structure.

Other aspects of the present disclosure can be understood by a person skilled in the art in light of the description, the claims, and the drawings of the present disclosure.

BRIEF DESCRIPTION OF THE DRAWINGS

To illustrate embodiments of the present disclosure more clearly, accompanying drawings which need to be used in the embodiments or the art are simply introduced below. Obviously, the accompanying drawings described below are merely some embodiments of the present disclosure, and a person skilled in the art can also obtain other drawings according to the accompanying drawings without creative efforts.

Structures, proportions, sizes and the like shown in the accompanying drawings are to be considered only in conjunction with the contents of the present specification to facilitate understanding and reading of a person skilled in the art, and are not intended to limit the scope of present disclosure, thus they do not hold any real technically significance, and any changes or modifications in the structures, the proportions, the sizes and the like should fall within the scope of the technical contents disclosed in the present disclosure as long as they do not affect the effects and the objectives achieved by the present disclosure.

DETAILED DESCRIPTION

Figure 1:
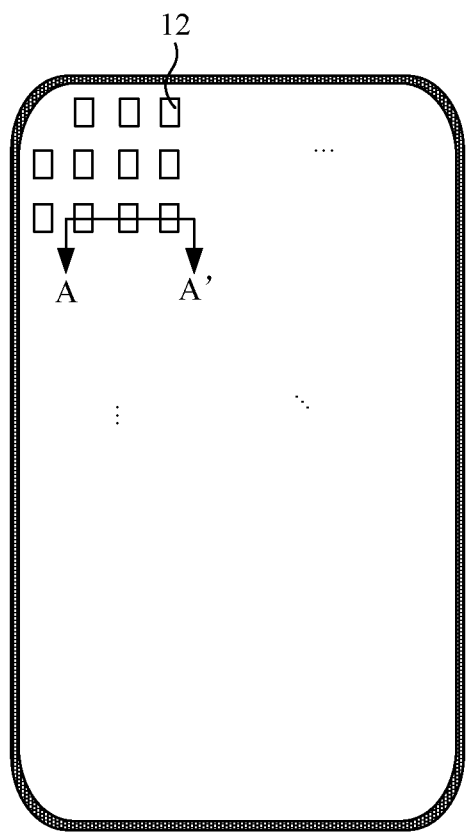
FIG. 1 illustrates a top view of a display panel provided by an embodiment of the present disclosure.

To make objectives, technical solutions, and advantages of the embodiments of the present disclosure clearer, the following clearly and completely describes the technical solutions in the embodiments of the present disclosure with reference to the accompanying drawings in the embodiments of the present disclosure. Obviously, the described embodiments are some but not all the embodiments of the present disclosure. All other embodiments obtained by a person skilled in the art based on the embodiments of the present disclosure without creative efforts fall within the protection scope of the present disclosure.

Organic light-emitting diode (OLED) display panels are currently one of mainstream display panels. To reduce reflections of some metal film layers in the OLED display panel to ambient light, a design method is to arrange polarizers on light-emitting sides of light-emitting elements. Although the design method can reduce a reflection of ambient light, 50% of a display brightness may be directly reduced.

Based on ensuring a display brightness of an OLED display panel, to reduce the reflection of ambient light, another design method is to install color-resist units on light-emitting sides of light-emitting elements to replace polarizers with color-resist units. The method can not only effectively reduce the reflection of ambient light, but also greatly reduce absorptions of lights emitted by light-emitting elements and improve a display brightness compared with the design method of using polarizers.

With the design of using color-resist units, a planarization layer needs to be arranged on light-emitting sides of the light-emitting elements and form a black matrix with a plurality of hollow areas on a surface of the planarization layer to form color-resist units in the hollow areas. However, the black matrix and the planarization layer are formed of materials with different properties. In the two materials, the organic resin molecules, dispersants, and viscosities are different, which may cause dispersion compatibility problems at an interface between the black matrix and the planarization layer, resulting in swelling and warping or even separation problems at the interface between the black matrix and the planarization layer.

In view of the above, in technical solution of the present disclosure, overlapping blocks of different color-resist layers in non-opening areas are multiplexed as a light-shielding structure, so that the display panel needs not to be arranged with the black matrix, thereby solving a problem of interlayer warping or even separation caused by different material properties between the black matrix and the planarization layer below the black matrix in an existing display panel, and ensuring a image quality and a service life of the display panel.

To make the above purposes, features and advantages of the present disclosure more obvious and understandable, the present disclosure is further described in detail below with reference to the accompanying drawings and specific embodiments.

Figure 2:
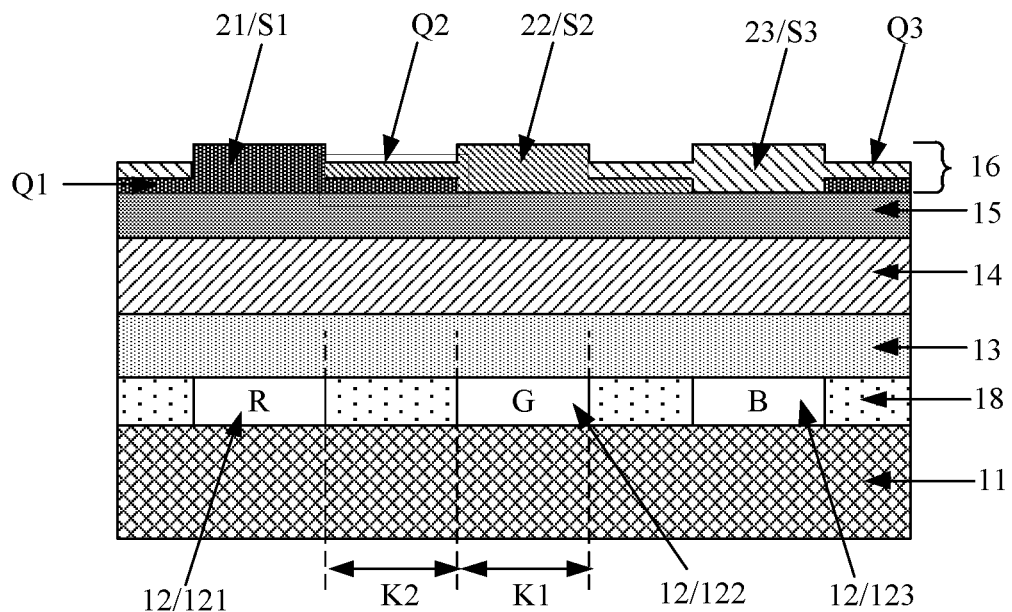
FIG. 2 illustrates an A-A cross-sectional view of the display panel shown in FIG. 1.

FIG. 1 illustrates a top view of a display panel provided by an embodiment of the present disclosure. FIG. 2 illustrates an A-A cross-sectional view of the display panel shown in FIG. 1. The display panel includes array substrate 11 including a plurality of open areas K1 and non-open areas K2 between adjacent open areas K1; a display array 12 on a side of the array substrate 11, the display array 12 at least including a first light-emitting element 121, a second light-emitting element 122 and a third light-emitting element 123 with different light-emitting colors, and the first light-emitting element 121, the second light-emitting element 122 and the third light-emitting elements 123 being respectively in corresponding opening areas K1; an encapsulation layer 13 covering the display array 12; a touch electrode layer 14 on a side of the encapsulation layer 13 away from the array substrate 14; a first planarization layer 15 covering the touch electrode layer 14; and a color-resist structure 16 on a side of the first planarization layer 15 away from the display array 12 and the color-resist structure 16 including a first color-resist layer 21, a second color-resist layer 22 and a third color-resist layer 23.

The first color-resist layer 21 includes a first color-resist unit S1 and a first block Q1. In a direction perpendicular to a plane where the array substrate 11 is located, the first color-resist unit S1 at least partially overlaps the first light-emitting element 121. The first block Q1 at least partially overlaps a non-opening area K2.

The second color-resist layer 22 includes a second color-resist unit S2 and a second block Q2; in the direction perpendicular to the plane where the array substrate 11 is located, the second color-resist unit S2 at least partially overlaps the second light-emitting element 122. The second block Q2 at least partially overlaps a non-opening area K2.

The third color-resist layer 23 includes a third color-resist unit S3 and a third block Q3. In the direction perpendicular to the plane where the array substrate 11 is located, the third color-resist unit S3 at least partially overlaps the third light-emitting element 123. The third block Q3 at least partially overlaps a non-opening area K2.

At least two of the first block Q1, the second block Q2 and the third block Q3 are stacked along the direction perpendicular to the plane of the array substrate 11 to form a light-shielding structure.

Each color-resist unit can transmit light emitted by a corresponding light-emitting element below each color-resist unit and block transmissions of light of other colors. For example, the first light-emitting element 121, the second light-emitting element 122, and the third light-emitting element 123 can be respectively a red sub-pixel R that emits red light, a green sub-pixel G that emits green light, and a blue sub-pixel B that emits blue light. That is, the first light-emitting element 121, the second light-emitting element 122 and the third light-emitting element 123 emit red light, green light, and blue light respectively. The first color-resist unit S1 can transmit red light and block transmissions of light of other colors. The second color-resist unit S2 can transmit green light and block transmissions of light of other colors. The third color-resist unit S3 can transmit blue light and block transmissions of light of other colors.

Along the direction perpendicular to the plane where the array substrate 11 is located, the light-shielding structure includes a stacked structure of at least two of the first block Q1, the second block Q2 and the third block Q3. Since blocks of different color-resist layers have different light transmission colors, a stacked structure composed of at least two of the first block Q1, the second block Q2 and the third block Q3 may theoretically completely block visible light and have a same shielding effect as the black matrix.

It can be understood that multiplexing the light-shielding structure as the black matrix between two adjacent color-resist units can realize an isolation of outgoing light of two adjacent light-emitting elements, prevent a crosstalk problem of the outgoing light of the two adjacent light-emitting elements, and can also block and absorb incident ambient light, reduce a reflection of the display panel on ambient light, and improve display quality. Compared with a design method of using polarizers to reduce a reflection of ambient light, the current design method of using a light-shielding structure theoretically has no loss to a display brightness and does not affect a display brightness of the display panel.

Moreover, the first planarization layer 15 in the display panel is made of an optical adhesive material, and the color-resist layer is made of a photoresist material. Compared with materials used in a conventional black matrix, the photoresist material and the optical adhesive material have relatively similar material properties, so degrees of dispersion and curing of the photoresist material and the optical adhesive material are higher. Therefore, a stability of a contact surface between the first planarization layer 15 and the color-resist layer on a surface of the first planarization layer 15 is good, and there is no problem of swelling, warping or even separation on the contact surface.

In the embodiment, a stacked structure formed by blocks of different color-resist layers can play a good role in shielding light and can be multiplexed as the black matrix. The black matrix needs not to be arranged in the display panel, to avoid warping or even interlayer separation between the black matrix and the planarization layer below the black matrix. Moreover, the contact surface between the first planarization layer 15 and the color-resist layer on the surface has good stability, and there is no problem of swelling, warping or even separation on the contact surface.

As shown in FIG. 2, the first block Q1 is integrated with the adjacent first color-resist unit S1; the second block Q2 is integrated with the adjacent second color-resist unit S2. The third block Q3 is integrated with the adjacent third color-resist unit S3. For a same color-resist layer, a color-resist unit and an adjacent block are integrally structured, which can not only be formed in a same process, but also avoid a gap caused by a separation of the color-resist unit and the adjacent block on a same color-resist layer, thereby avoiding light leakage caused by the gap.

Optionally, the first color-resist unit S1 is adjacent to the second color-resist unit S2. The light-shielding structure includes a first light-shielding structure shown by a dashed box in FIG. 2. The first light-shielding structure is between the first color-resist unit S1 and the second color-resist unit S2 and includes the first block Q1 and the second block Q2. Based on a stacked structure of the first block Q1 and the second block Q2, the first light-shielding structure can be formed between the first color-resist unit S1 and the second color-resist unit S2, and the first light-shielding structure is multiplexed as the black matrix between the first color-resist unit S1 and the second color-resistive unit S2. A better light-shielding effect can be achieved by stacking blocks of two different color-resist layers, and an implementation method is simple.

As shown in FIG. 2, the two adjacent color-resist units on two sides of the first light-shielding structure are the first color-resist unit S1 and the second color-resist unit S2, respectively. The first color-resistor unit S1 and the second color-resistor unit S2 correspond to the red sub-pixel R and the green sub-pixel G respectively, and the first color-resistor unit S1 and the second color-resistor unit S2 can transmit red light and green light respectively. In the first light-shielding structure, the first block Q1 and the second block Q2 can transmit red light and green light respectively. Therefore, when ambient light enters the first light-shielding structure, the ambient light first passes through the second block Q2, and green light can pass through the second block Q2, and visible light of other colors is blocked and absorbed by the second block Q2. The green light incident on the first block Q1 through the second block Q2 is blocked and absorbed in the first block Q1, thereby realizing blocking and absorption of the ambient light.

In one embodiment shown in FIG. 2, the light-shielding structure between two adjacent light-emitting elements is a stacked structure of any two of the first block Q1, the second block Q2 and the third block Q3.

Figure 3:
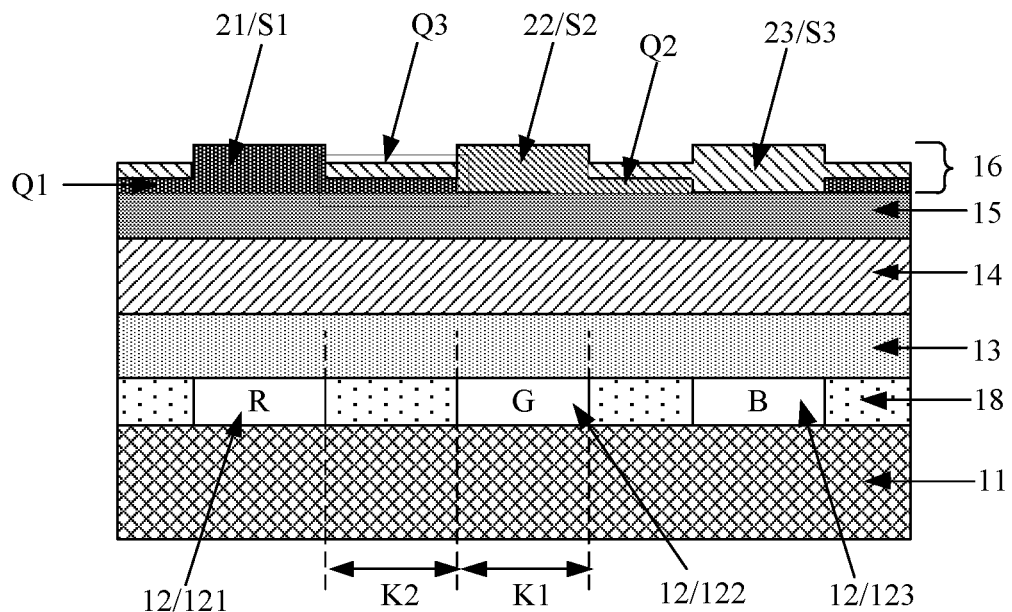
FIG. 3 illustrates a cross-sectional view of a display panel provided by an embodiment of the present disclosure.

FIG. 3 illustrates a cross-sectional view of a display panel provided by an embodiment of the present disclosure. In one embodiment, the first color-resist unit S1 is adjacent to the second color-resist unit S2, and the light-shielding structure includes a second light-shielding structure shown by the dotted box in FIG. 3. The second light-shielding structure is between the first color-resist unit S1 and the second color-resist unit S2, and the second light-shielding structure includes the first block Q1 and the third block Q3. In the embodiment, based on a stacked structure of the first block Q1 and the third block Q3, the second light-shielding structure can be formed between the first color-resist unit S1 and the second color-resist unit S2. The second light-shielding structure is multiplexed as the black matrix between the first color-resist unit S1 and the second color-resist unit S2. A better light-shielding effect can be achieved by stacking blocks of two different color-resist layers, and an implementation method is simple.

As shown in FIG. 3, the two adjacent color-resist units on two sides of the second light-shielding structure are the first color-resist unit S1 and the second color-resist unit S2, respectively. The first color-resistor unit S1 and the second color-resistor unit S2 correspond to the red sub-pixel R and the green sub-pixel G respectively, and the first color-resistor unit S1 and the second color-resistor unit S2 can transmit red light and green light respectively. In the second light-shielding structure, the first block Q1 and the third block Q3 can transmit red light and blue light respectively. Therefore, when ambient light enters the second light-shielding structure, the ambient light first passes through the third block Q3, blue light can pass through the third block Q3, and visible light of other colors is blocked and absorbed by the third block Q3, and the blue light entering the first block Q1 through the third block Q3 is blocked and absorbed in the first block Q1, thereby realizing blocking and absorption of the ambient light.

In the embodiment, when the light-shielding structure is a stacked block structure with two different color-resist layers, a stacking method of blocks in the light-shielding structure in an area corresponding to a non-opening area K2 is not limited to a stacking method shown in FIG. 2 and FIG. 3. The light-shielding structure can be arranged to be a stacked structure of any two of the first block Q1, the second block Q2 and the third block Q3.

Optionally, as shown in FIG. 2 and FIG. 3, the first color-resist unit S1, the second color-resist unit S2, and the third color-resist unit S3 can be arranged to have a same first thickness. The light-shielding structure has a second thickness which is not greater than the first thickness. Arranging the second thickness not greater than the first thickness can avoid a need to arrange other thicker film layers above the color-resist structure 16 if the second thickness is larger, so that the display panel has a thinner thickness. Other film layers include a second planarization layer hereinafter.

Figure 4:
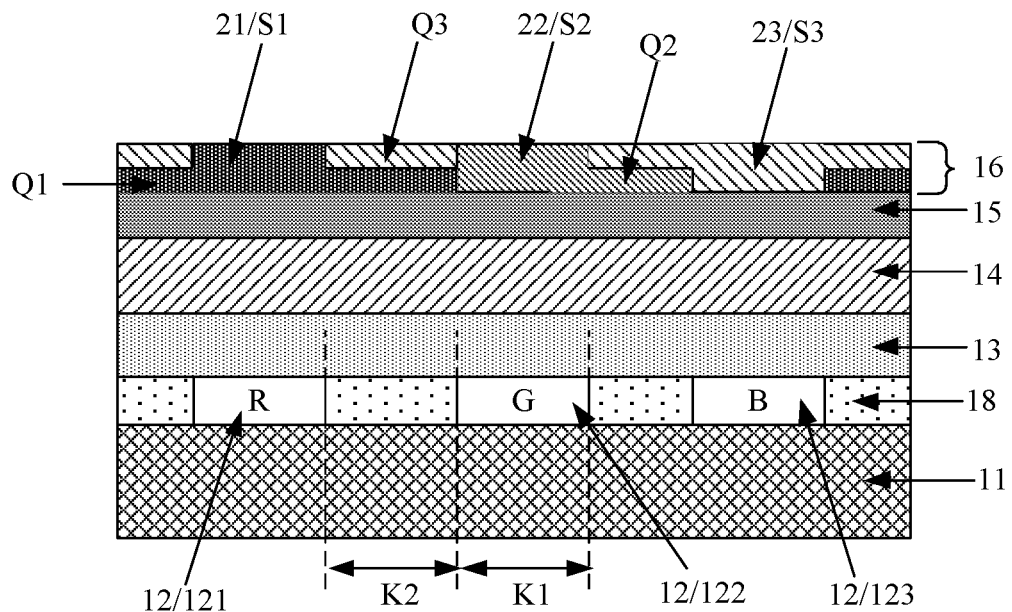
FIG. 4 illustrates a cross-sectional view of another display panel provided by an embodiment of the present disclosure.

It should be noted that, in the embodiment, a thickness refers to a dimension of a film layer in the direction perpendicular to the plane where the array substrate 11 is located. In the embodiments shown in FIG. 2 and FIG. 3, the second thickness being smaller than the first thickness is taken as an example for illustration. As shown in FIG. 4, the display panel can also be arranged to have the second thickness equal to the first thickness.

FIG. 4 illustrates a cross-sectional view of another display panel provided by an embodiment of the present disclosure. Based on the embodiment shown in FIG. 3, in a display panel shown in FIG. 4, the second thickness is equal to the first thickness.

Optionally, arranging the second thickness equal to the first thickness can make a surface of the color-resist structure 16 away from the array substrate 11 have a better flatness, thereby reducing thicknesses of other film layers required on an upper surface of the color-resist structure 16 to the greatest extent, so that the display panel has a smaller thickness.

In the embodiment, the light-shielding structure is not limited to being formed by stacking two of the first block Q1, the second block Q2, and the third block Q3 as shown in FIGS. 2-4. A light-shielding structure can also be arranged as shown in FIG. 5.

Figure 5:
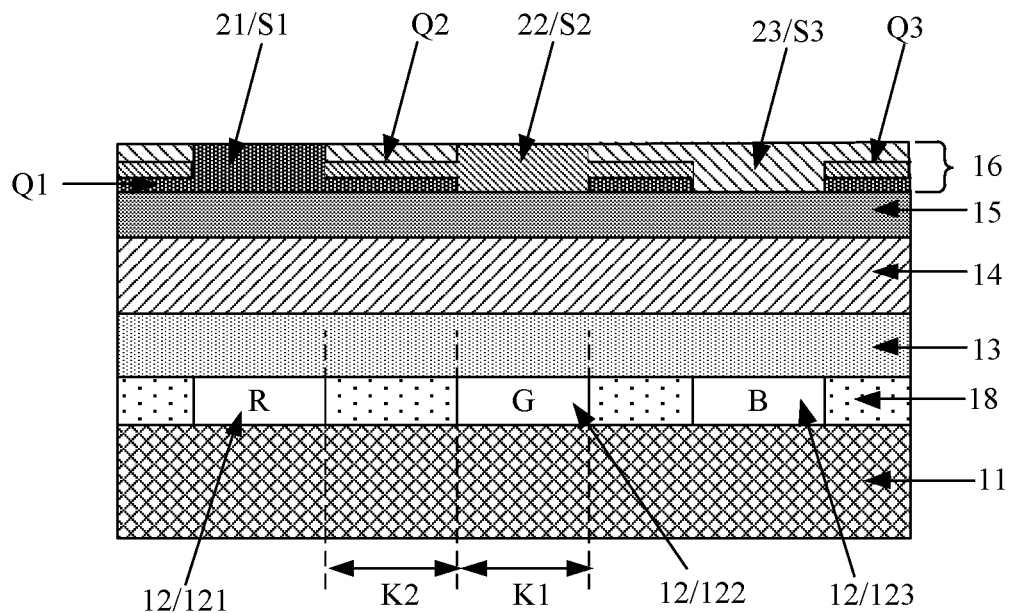
FIG. 5 illustrates a cross-sectional view of another display panel provided by an embodiment of the present disclosure.

FIG. 5 illustrates a cross-sectional view of another display panel provided by an embodiment of the present disclosure. Different from the embodiments shown in FIGS. 2-4, the light-shielding structure in one embodiment shown in FIG. 5 includes the first block Q1, the second block Q2 and the third block Q3. Arranging the shielding structure being a stacked structure of three blocks with different light-transmitting colors can better block transmission of visible light, better achieve an isolation effect of the light emitted by two adjacent light-emitting elements and reduce a reflection effect of ambient light.

When the light-shielding structure includes the first block Q1, the second block Q2 and the third block Q3, as mentioned above, the second thickness can also be arranged to be no greater than the first thickness, so that a surface of the color-resist structure 16 away from the array substrate 11 has a better flatness, to reduce thicknesses of other film layers on a surface of the color-resist structure 16, so that the display panel has a thinner thickness.

In the embodiment, the first color-resist unit S1, the second color-resist unit S2, and the third color-resist unit S3 are arranged to have a same first thickness, and thicknesses of the first block Q1, the second block Q2, and the third block Q3 are all a third thickness to facilitate forming each color-resist layer, thereby simplifying a forming process of the color-resist structure 16.

When the shielding structure includes the first block Q1, the second block Q2 and the third block Q3, and the thicknesses of the first block Q1, the second block Q2 and the third block Q3 are all the third thickness, to make the second thickness not greater than the first thickness, the third thickness may be arranged to be not greater than one-third of the first thickness.

Optionally, the third thickness is set to be equal to one-third of the first thickness. Therefore, the second thickness is equal to the first thickness, so that a surface of the color-resist structure 16 away from the array substrate 11 has a better flatness, to reduce thicknesses of other film layers on a surface of the color-resist structure 16.

As shown in FIG. 4, when the shielding structure includes any two of the first block Q1, the second block Q2 and the third block Q3, the thicknesses of the first block Q1, the second block Q2 and the third block Q3 are all arranged to be a fourth thickness, and the fourth thickness is equal to one-half of the first thickness. Therefore, the second thickness can also be made equal to the first thickness, so that a surface of the color-resist structure 16 away from the array substrate 11 has a better flatness, to reduce thicknesses of other film layers on a surface of the color-resist structure 16.

As shown in FIGS. 2-5, a pixel definition layer 18 including a plurality of pixel openings is arranged on the array substrate 11. The first light-emitting element 121, the second light-emitting element 122 and the third light-emitting element 123 are in corresponding pixel openings respectively.

An orthographic projection of the first light-emitting element 121 on the array substrate 11 is in a range of an orthographic projection of the first color-resist unit S1 on the array substrate 11. An orthographic projection of the second light-emitting element 122 on the array substrate 11 is in a range of the orthographic projection of the second color-resist unit S2 on the array substrate 11. An orthographic projection of the third light-emitting element 123 on the array substrate 11 is in a range of the orthographic projection of the third color-resist unit S3 on the array substrate 11. Arranging an orthographic projection of each light-emitting element on the array substrate 11 to be in a range of an orthographic projection of a corresponding color-resist unit on the array substrate 11 can enable the color-resist unit to achieve a greater degree of light filtering for the corresponding light-emitting element to prevent variegated light from passing through an area corresponding to the light-emitting element and reduce an interference between light of different colors.

When an orthographic projection of a light-emitting element on the array substrate 11 is in an orthographic projection of a corresponding color-resist unit on the array substrate 11, the orthographic projection of the light-emitting element on the array substrate 11 can be arranged to coincide exactly with the orthographic projection of the corresponding color-resist unit on the array substrate 11, or an orthographic projection area of the light-emitting element on the array substrate 11 is arranged to be smaller than an orthographic projection area of the corresponding color-resist unit on the array substrate 11.

Figure 6:
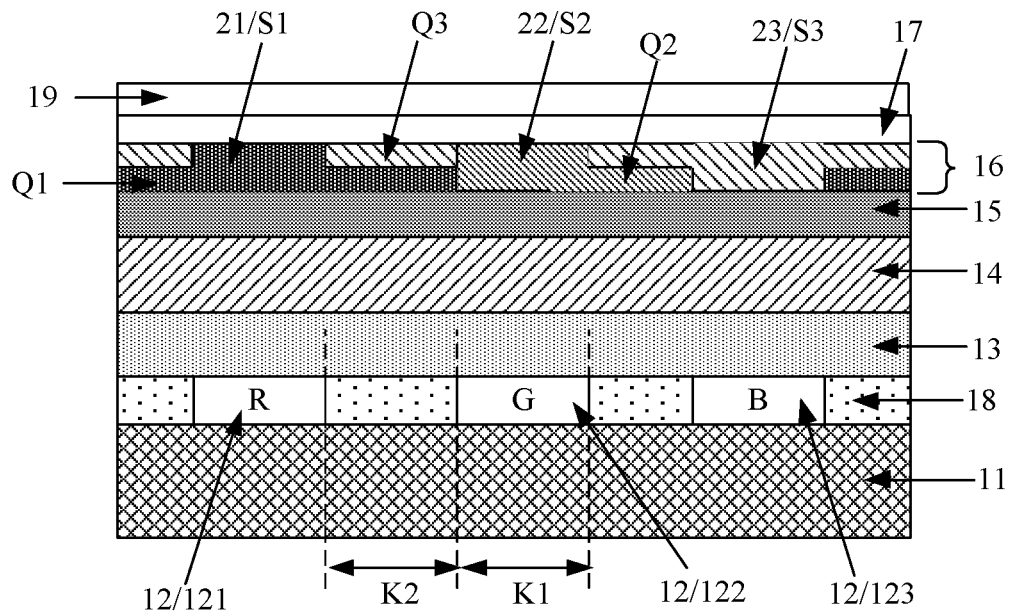
FIG. 6 illustrates a cross-sectional view of another display panel provided by an embodiment of the present disclosure.

FIG. 6 illustrates a cross-sectional view of another display panel provided by an embodiment of the present disclosure. Based on the above embodiment, the display panel shown in FIG. 6 further includes a second planarization layer 17 covering the color-resist structure 16; and a cover plate 19 on a side of the second planarization layer 17 away from the color-resist structure 16.

By arranging the second planarization layer 17, a flatness of the surface can be ensured, which facilitates to attach and fix the cover plate 19 on a light-emitting side of the display panel. The cover plate 19 may be a glass cover plate.

Figure 7:
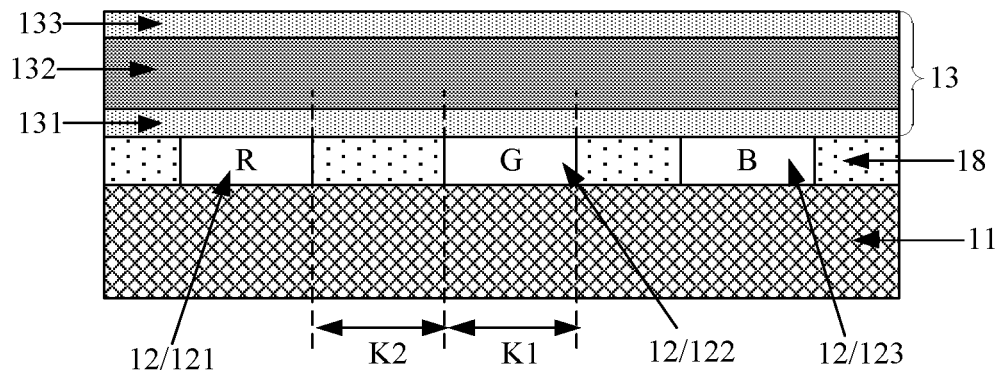
FIG. 7 illustrates a cross-sectional view of another display panel provided by an embodiment of the present disclosure.

FIG. 7 illustrates a cross-sectional view of another display panel provided by an embodiment of the present disclosure. To illustrate a hierarchical structure of the encapsulation layer 13 clearly, one embodiment shown in FIG. 7 does not show a structure of each layer of the encapsulation layer 13 on a side away from the array substrate 11. Based on the above embodiment, in the display panel shown in FIG. 7, the encapsulation layer 13 includes a first inorganic layer 131, a first organic layer 132 and a second inorganic layer 133 sequentially stacked along a direction away from the array substrate 11. The encapsulation layer 13 includes two inorganic layers and an organic layer sandwiched between the two inorganic layers, which can effectively isolate water and oxygen from corroding a structure below the encapsulation layer 13 to increase a service life.

Figure 8:
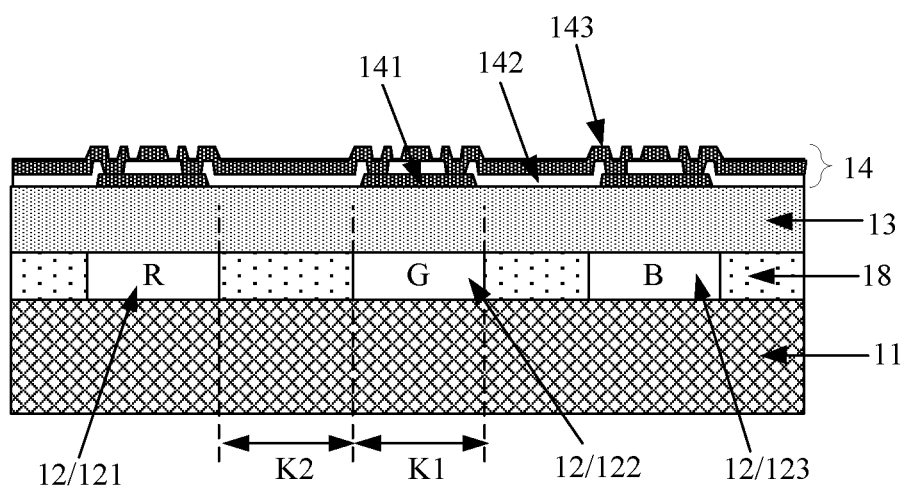
FIG. 8 illustrates a cross-sectional view of another display panel provided by an embodiment of the present disclosure.

FIG. 8 illustrates a cross-sectional view of another display panel provided by an embodiment of the present disclosure. To illustrate a hierarchical structure of the touch electrode layer 14 clearly, one embodiment shown in FIG. 8 does not show a structure of each layer of the touch electrode layer 14 on a side away from the array substrate 11. Based on the above embodiments, in the display panel shown in FIG. 8, the touch electrode layer 14 includes a first touch electrode layer 141, an insulation layer 142 and a second touch electrode layer 143 sequentially stacked along the direction away from the array substrate 11. In the embodiment, the first touch electrode layer 141 is formed on the encapsulation layer 13, and the second touch electrode layer 143 is formed on the first touch electrode layer 141, so that a touch function can be integrated in the display panel, and a thickness of the panel can be reduced, so that a panel structure and a corresponding forming process are simple.

In the touch electrode layer 14, the first touch electrode layer 141 and the second touch electrode layer 143 are patterned conductive layers. Pattern structures of the first touch electrode layer 141 and the second touch electrode layer 143 based on requirements are arranged to form a desired touch electrode pattern. The embodiment does not specifically limit a pattern structure of the touch electrodes. The first touch electrode layer 141 and the second touch electrode layer 143 can be transparent conductive layers or metal grid structures.

Since the pattern structures of the first touch electrode layer 141 and the second touch electrode layer 143 may cause the touch electrode layer 14 to be uneven, as shown in the accompanying drawings of the above embodiment, by arranging the first planarization layer 15 on the touch electrode layer 14, a flatness can be ensured to provide a relatively flat surface for the color-resist structure 16.

It can be seen from the above description that in the display panel provided by the embodiment, at least two of the first block Q1, the second block Q2 and the third block Q3 are stacked to form the light-shielding structure in an area of the display panel corresponding to the non-opening area K2, so that the light-shielding structure can theoretically completely block visible light and play a light-shielding role. The light-shielding structure can be multiplexed as the black matrix. Therefore, the black matrix needs not to be separately arranged in the display panel, and the light-shielding structure formed by blocks of different color-resist layers can replace the conventional black matrix structure. The light-shielding structure formed by the blocks of different color-resist layers is used as the black matrix for light-shielding, which can not only realize a light isolation between different light-emitting elements, prevent a cross-talk problem of display lights of different colors, but also avoid warping or even separation between the film layers caused by a large difference in material properties between the black matrix and the planarization layers.

In the embodiment, the display panel may be an OLED display panel or a micro LED display panel. The light-emitting element in the OLED display panel is an OLED device. The light-emitting element in the micro LED display panel is a Micro LED device or a Mini LED device. The display panel is not limited to include three sub-pixels of red sub-pixel, green sub-pixel, and blue sub-pixel, and may also include a fourth light-emitting element configured to emit white light for brightness compensation, or other visible light for color tone compensation.

A type of the display panel is not limited to an OLED display panel or a micro-LED display panel, and may also be an LCD panel, and the light-shielding structure may also replace the black matrix in the LCD display panel.

Figure 9:
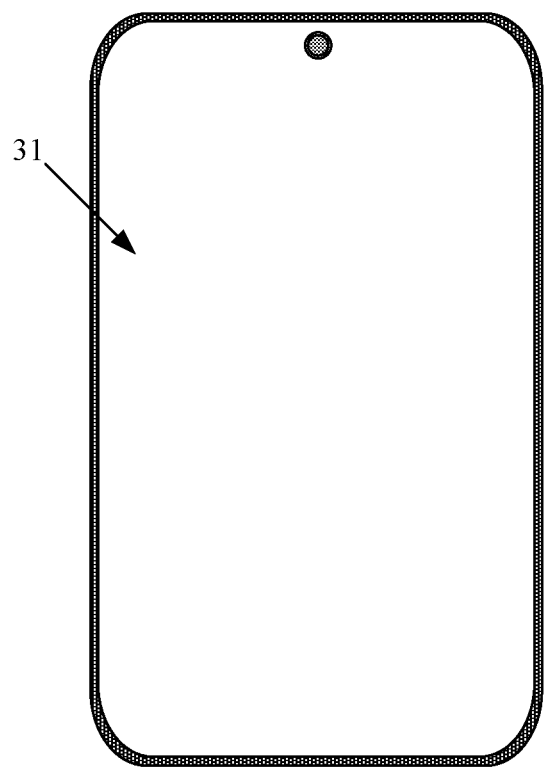
FIG. 9 illustrates a schematic diagram of a display device provided by an embodiment of the present disclosure.

Based on the display panel provided by the above embodiments, as shown in FIG. 9, another embodiment of the present disclosure also provides a display device.

FIG. 9 illustrates a schematic diagram of the display device provided by an embodiment of the present disclosure. The display device includes the display panel 31 provided in any one of the above embodiments.

The display device may be an electronic product such as a smart phone, a tablet computer, an all-in-one computer, a home appliance with a display function, or a smart wearable device. A black matrix needs not to be arranged in the display panel 31 in the embodiment, which solves a problem of interlayer warping or even separation between the black matrix and the planarization layer below the black matrix, ensures a display effect and a service life of the display panel, thereby improving a display quality and a service life of the display device.

Figure 10:
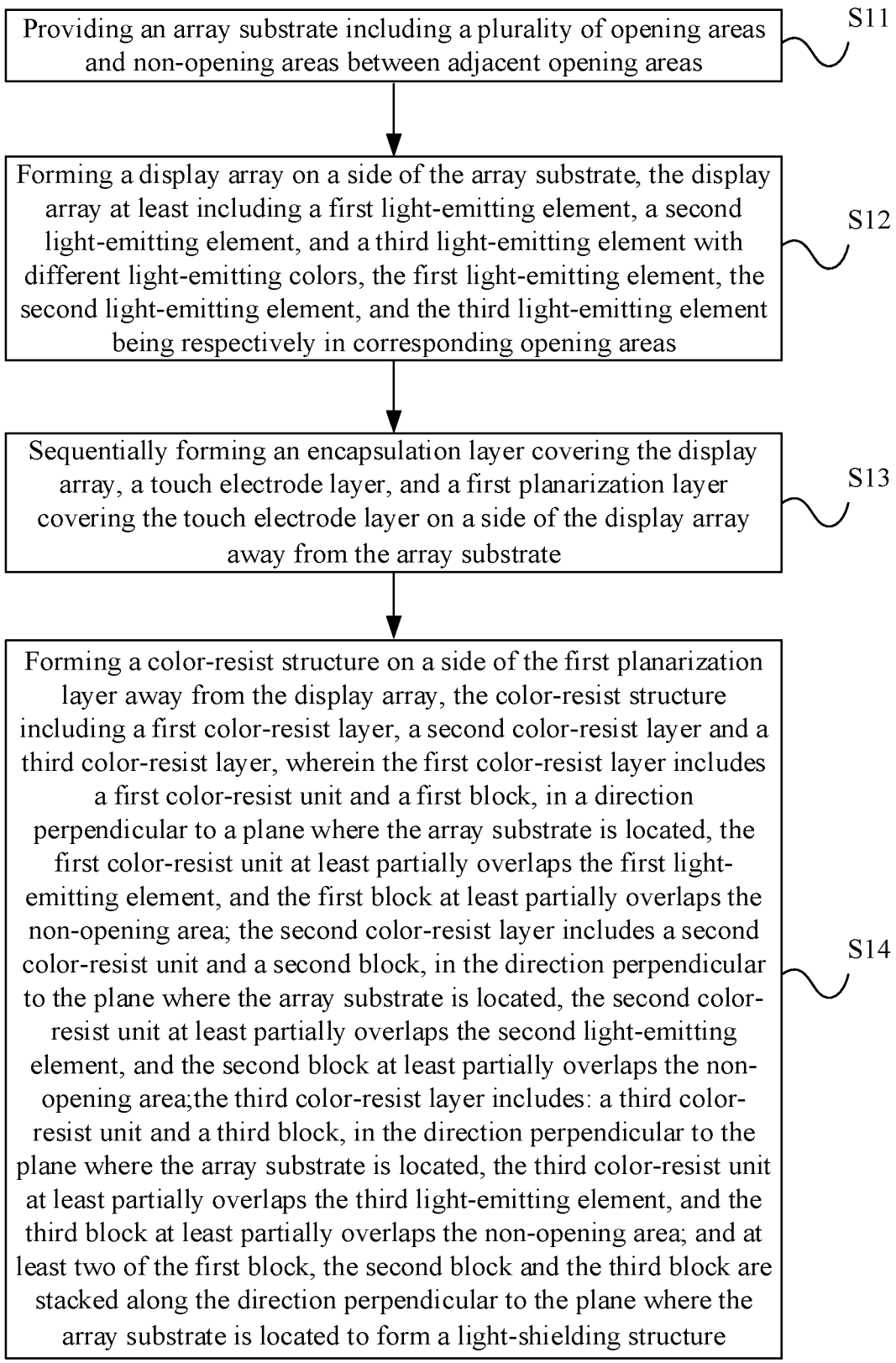
FIG. 10 illustrates a flow chart of a forming method of a display panel provided by an embodiment of the present disclosure.

Based on the above embodiments, as shown in FIG. 10, another embodiment also provides a forming method of a display panel, which is used to form the display panel described in any of the above embodiments.

FIG. 10 illustrates a flow chart of a forming method of a display panel provided by an embodiment of the present disclosure. The method includes the following steps.

S11: providing an array substrate including a plurality of opening areas and non-opening areas between adjacent opening areas.

S12: forming a display array on a side of the array substrate, the display array at least including a first light-emitting element, a second light-emitting element, and a third light-emitting element with different light-emitting colors; the first light-emitting element, the second light-emitting element, and the third light-emitting element being respectively in corresponding opening areas.

S13: sequentially forming an encapsulation layer covering the display array, a touch electrode layer, and a first planarization layer covering the touch electrode layer on a side of the display array away from the array substrate.

S14: forming a color-resist structure on a side of the first planarization layer away from the display array.

The color-resist structure includes a first color-resist layer, a second color-resist layer and a third color-resist layer. The first color-resist layer includes a first color-resist unit and a first block. In a direction perpendicular to the plane where the array substrate is located, the first color-resist unit at least partially overlaps the first light-emitting element, and the first block at least partially overlaps the non-opening area. The second color-resist layer includes a second color-resist unit and a second block. In a direction perpendicular to the plane where the array substrate is located, the second color-resist unit at least partially overlaps the second light-emitting element, and the second block at least partially overlaps the non-opening area. The third color-resist layer includes: a third color-resist unit and a third block. In a direction perpendicular to the plane where the array substrate is located, the third color-resist unit at least partially overlaps the third light-emitting element, and the third block at least partially overlaps the non-opening area. At least two of the first block, the second block and the third block are stacked along a direction perpendicular to the plane where the array substrate is located to form the light-shielding structure.

Based on the forming method provided by the embodiment, the display panels in the above embodiments can be formed, so that the formed display panels can multiplex blocks in different color-resist layers as the light-shielding structure. The black matrix needs not to be arranged in the display panel, which solves the problem of interlayer warpage or even separation caused by different material properties between the black matrix and the planarization layer below the black matrix in an existing display panel and ensures an image quality and a service life of the display panel.

Figure 11:
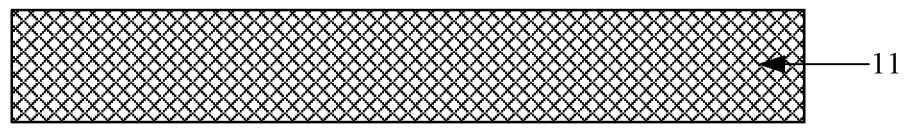
FIG. 11 illustrates a cross-sectional view of a structure obtained after performing S11 in a forming method of a display panel provided by an embodiment of the present disclosure.
Figure 12:
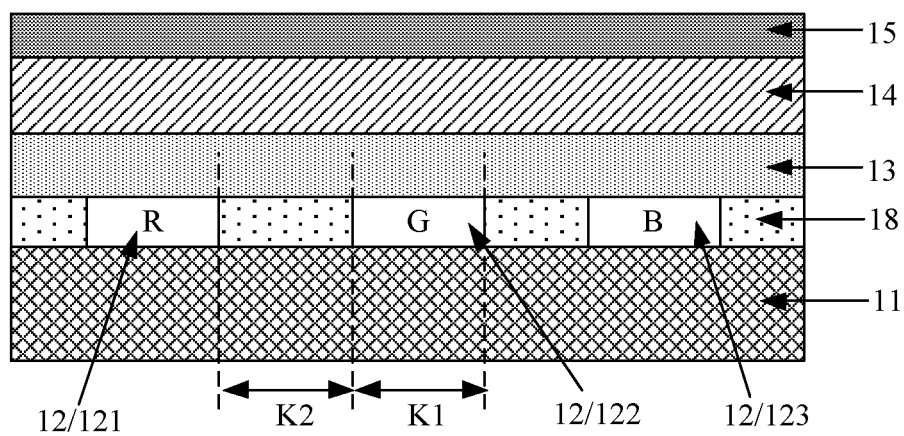
FIG. 12 illustrates a cross-sectional view of a structure obtained after performing S12 and S13 in a forming method of a display panel provided by an embodiment of the present disclosure.
Figure 13:
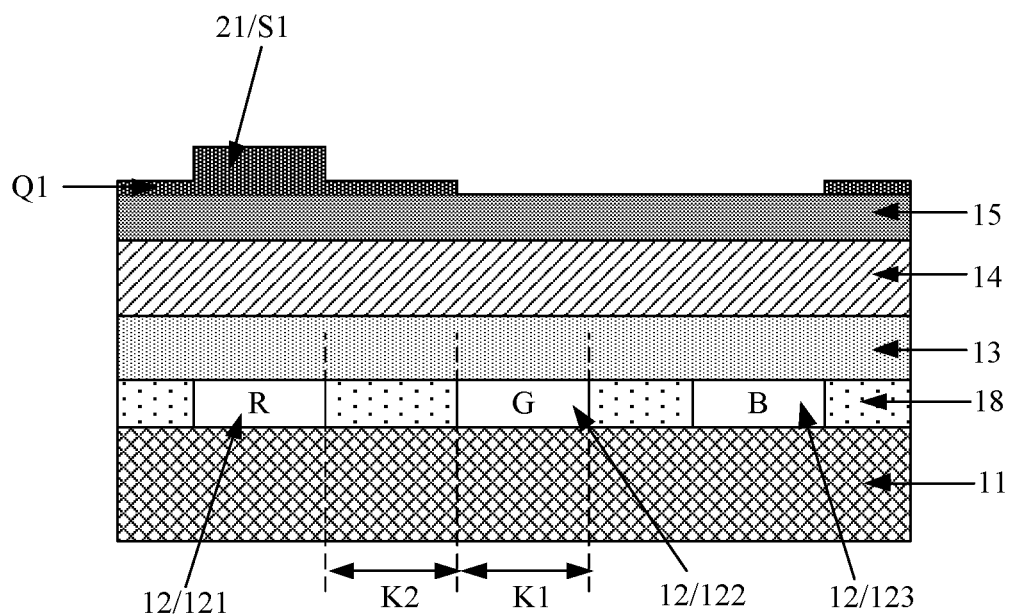
FIG. 13 illustrates a cross-sectional view of each structure after forming a first color-resist layer in a forming method of a display panel provided by an embodiment of the present disclosure.
Figure 14:
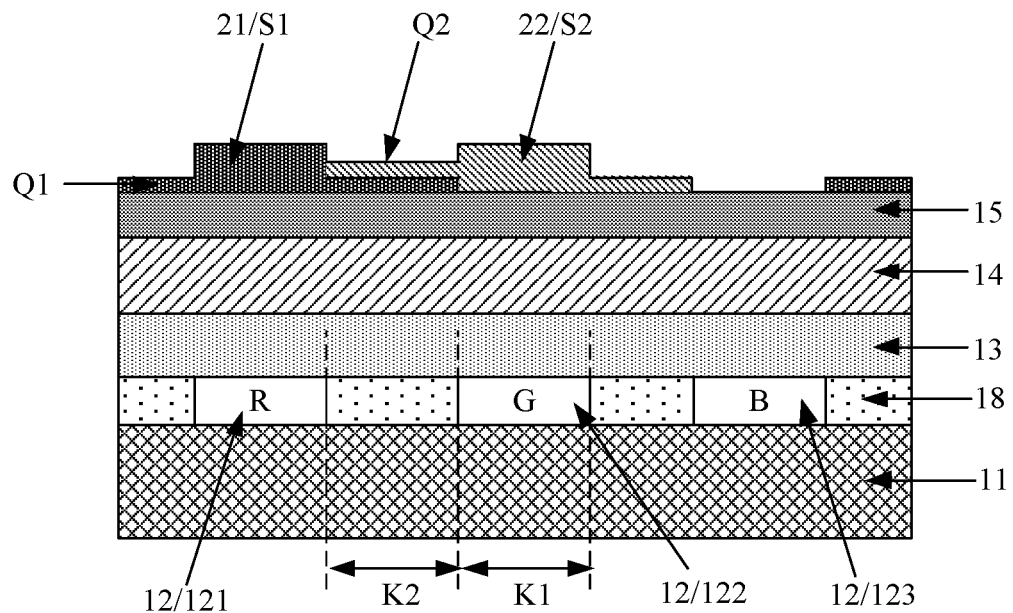
FIG. 14 illustrates a cross-sectional view of each structure after forming a second color-resist layer in a forming method of a display panel provided by an embodiment of the present disclosure.
Figure 15:
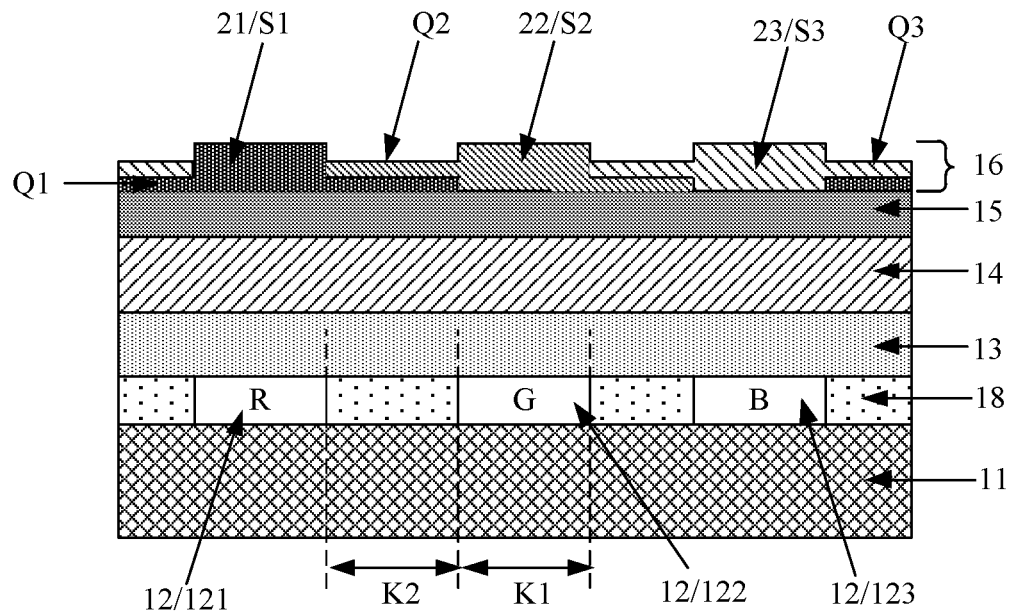
FIG. 15 illustrates a cross-sectional view of each structure after forming a third color-resist layer in a forming method of a display panel provided by an embodiment of the present disclosure.

The forming method of the display panel provided by the embodiment are described in detail below with reference to FIGS. 11-16. FIG. 11 illustrates a cross-sectional view of a structure obtained after performing S11 in a forming method of a display panel provided by an embodiment of the present disclosure. FIG. 12 illustrates a cross-sectional view of a structure obtained after performing S12 and S13 in a forming method of a display panel provided by an embodiment of the present disclosure. FIG. 13 illustrates a cross-sectional view of each structure after forming a first color-resist layer in a forming method of a display panel provided by an embodiment of the present disclosure. FIG. 14 illustrates a cross-sectional view of each structure after forming a second color-resist layer in a forming method of a display panel provided by an embodiment of the present disclosure. FIG. 15 illustrates a cross-sectional view of each structure after forming a third color-resist layer in a forming method of a display panel provided by an embodiment of the present disclosure.

Referring to FIG. 11, an array substrate 11 including a plurality of opening areas K1 and non-opening areas K2 between adjacent opening areas K1 is provided in S11.

It can be understood that the array substrate 11 has a thin film transistor (TFT) array for controlling light-emitting elements to emit light. The accompanying drawings of the embodiments do not show TFTs, and a design method of the TFTs in the array substrate 11 may adopt an existing circuit layout method, which is not specifically limited herein.

Referring to FIG. 12, a display array is formed on one side of the array substrate in S12. The display array 12 includes at least a first light-emitting element 121, a second light-emitting element 122 and a third light-emitting element 123 with different light-emitting colors. The first light-emitting element 121, the second light-emitting element 122 and the third light-emitting element 123 are respectively in corresponding opening areas K1.

Optionally, the first light-emitting element 121 is a red sub-pixel R, the second light-emitting element 122 is a green sub-pixel G, and the third light-emitting element 123 is a blue sub-pixel B.

Optionally, before forming the display array 12, a pixel definition layer 18 can be formed on a side of the array substrate 11. A plurality of pixel openings is arranged on the pixel definition layer 18. When the light-emitting elements are formed, the light-emitting elements can be formed in the pixel openings of the pixel definition layer 18.

Referring to FIG. 12, on a side of the display array 12 away from the array substrate 11, an encapsulation layer 13 covering the display array, a touch electrode layer 14 and a first planarization layer 15 covering the touch electrode layer 14 are sequentially formed in S13.

It can be understood that the encapsulation layer 13 is formed on a light-emitting side of the display array 12 to encapsulate and protect the light-emitting elements. A touch electrode layer 14 is formed on a side of the encapsulation layer 13 away from the array substrate 11 to integrate a touch function in the display panel. The first planarization layer 15 is formed on a side of the touch electrode layer 14 away from the array substrate 11 to have a flat surface for forming the color-resist structure 16 in a subsequent process.

Referring to FIGS. 13-15, A color-resist structure 16 is formed on the side of the first planarization layer 15 away from the display array 12 in S14. The color-resist structure 16 includes a first color-resist layer 21, a second color-resist layer 22 and a third color-resist layer 23. The first color-resist layer 21 includes a first color-resist unit S1 and a first block Q1. In a direction perpendicular to the plane where the array substrate 11 is located, the first color-resist unit S1 at least partially overlaps the first light-emitting element 121, and the first block Q1 at least partially overlaps the non-opening area K2. The second color-resist layer 22 includes a second color-resist unit S2 and a second block Q2. In a direction perpendicular to the plane where the array substrate 11 is located, the second color-resist unit S2 at least partially overlaps the second light-emitting element 122, and the second block Q2 at least partially overlaps the non-opening area K2. The third color-resist layer 23 includes a third color-resist unit S3 and a third block Q3. In a direction perpendicular to the plane where the array substrate 11 is located, the third color-resist unit S3 at least partially overlaps the third light-emitting element 123, and the third block Q3 at least partially overlaps the non-opening area K2. At least two of the first block Q1, the second block Q2 and the third block Q3 are stacked along a direction perpendicular to the plane where the array substrate 11 is located to form the light-shielding structure.

In one embodiment, the first color-resist layer 21, the second color-resist layer 22, and the third color-resist layer 23 can be formed separately. For example, the first color-resist layer 21 is formed first, then the second color-resist layer 22 is formed, and finally the third color-resist layer 23 is formed.

In some embodiments, a thickness of the first color-resist unit S1 is greater than a thickness of the first block Q1, and the first color-resist unit S1 and the first block Q1 are formed by one patterning process. A thickness of the second color-resist unit S2 is greater than a thickness of the second block Q2, and the second color-resist unit S2 and the second block Q2 are formed by one patterning process. A thickness of the third color-resist unit S3 is greater than a thickness of the third block Q3, and the third color-resist unit S3 and the third block Q3 are formed by one patterning process. Therefore, color-resist units and blocks that transmit same visible light are formed based on a same patterning process, that is, the first color-resist layer 21, the second color-resist layer 22, and the third color-resist layer 23 can be formed through one patterning process and the forming process is simple.

In some embodiments, forming the color-resist structure 16 on the side of the first planarization layer 15 away from the display array 12 includes synchronously forming the first color-resist unit S1 and the first block Q1 on the side of the first planarization layer 15 away from the display array 12 based on a halftone mask; synchronously forming the second color-resist unit S2 and the second block Q2 on the side of the first planarization layer 15 away from the display array 12 based on a halftone mask; and synchronously forming the third color-resist unit S3 and the third block Q3 on the side of the first planarization layer 15 away from the display array 12 based on a halftone mask.

The first block Q1 is integrated with the adjacent first color-resist unit S1; the second block Q2 is integrated with the adjacent second color-resist unit S2. The third block Q3 is integrated with the adjacent third color-resist unit S3.

The above color-resist structure 16 can be formed by using halftone masks for three patterning processes to respectively form the first color-resist layer 21, the second color-resist layer 22 and the third color-resist layer 23. A forming process is simple, and a forming cost is low. To facilitate understanding of the forming process of the color-resist units and blocks based on the halftone masks in the embodiment, the above forming method are described in detail below.

Firstly, the first color-resist layer 21 is assumed to be formed. When the first color-resist layer 21 is formed, a layer of unpatterned first color-resist layer 21 is first coated on the first planarization layer 15, and an unpatterned first photoresist layer is formed on the surface of the first color resist layer 21. The first photoresist layer is patterned by using a first mask plate. The first mask plate has a first area corresponding to the first color-resist unit S1, a second area corresponding to the first block Q1, and a third area corresponding to the second color-resist unit S2 and the third color-resist unit S3. Exposure rates of the first photoresist layer in the first area, the second area and the third area are sequentially reduced, so that a thickness of the patterned first photoresist layer decreases sequentially in the first area, the second area and the third area. Generally, the thickness of the first photoresist layer in the third area is zero, which means no photoresist in the third area. Therefore, when the first color-resist layer 21 is patterned based on the patterned first photoresist layer, the first color-resist layer 21 in the third area can be completely removed, and the thickness of the first block Q1 is smaller than the thickness of the first color-resist unit S1.

Secondly, the second color-resist layer 22 is formed. When the second color-resist layer 22 is formed, the unpatterned second color-resist layer 22 is coated, and an unpatterned second photoresist layer is coated on the second color-resist layer 22, the second color-resist layer covers the first color-resist layer 21 and the first planarization layer 15. The second photoresist layer is patterned by using a second mask plate. The second mask plate has a fourth area corresponding to the second color-resist unit S2, a fifth area corresponding to the second block Q2, and a sixth area corresponding to the first color-resist unit S1 and the third color-resist unit S3. Exposure rates of the fourth area, the fifth area and the sixth area to the second photoresist layer are sequentially reduced, so that a thickness of the patterned second photoresist layer 22 decrease sequentially in the fourth area, the fifth area and the sixth area. Generally, the thickness of the second photoresist layer in the sixth area is zero, which means no photoresist in the sixth area. Therefore, when the second color-resist layer 22 is patterned based on the patterned second photoresist layer, the second color-resist layer in the sixth area can be completely removed, and the thickness of the second block Q2 is smaller than the thickness of the second color-resist unit S2.

Finally, the third color-resist layer 23 is formed. When the third color-resist layer 23 is formed, the unpatterned third color-resist layer 23 is coated, and an unpatterned third photoresist layer is coated on the third color-resist layer 23. The third color-resist layer covers the first color-resist layer 21, the second color-resist layer 22 and the first planarization layer 15. The third photoresist layer is patterned by using a third mask plate. The third mask plate has a seventh area corresponding to the third color-resist unit S3, an eighth area corresponding to the third block Q3, and a ninth area corresponding to the first color-resist unit S1 and the second color-resist unit S2. Exposure rates of the seventh area, the eighth area and the ninth area to the third photoresist layer are sequentially reduced, so that a thickness of the patterned third photoresist layer decreases sequentially in the seventh area, the eighth area and the ninth area. Generally, the thickness of the third photoresist layer in the ninth area is zero, which means no photoresist in the ninth area. Therefore, when the third color-resist layer 23 is patterned based on the patterned third photoresist layer, the third color-resist layer 23 in the ninth area can be completely removed, and the thickness of the third block Q3 is smaller than the thickness of the third color-resist unit S3.

It should be noted that, in the embodiment, an order of forming the three color-resist layers is not limited to the above method.

Figure 16:
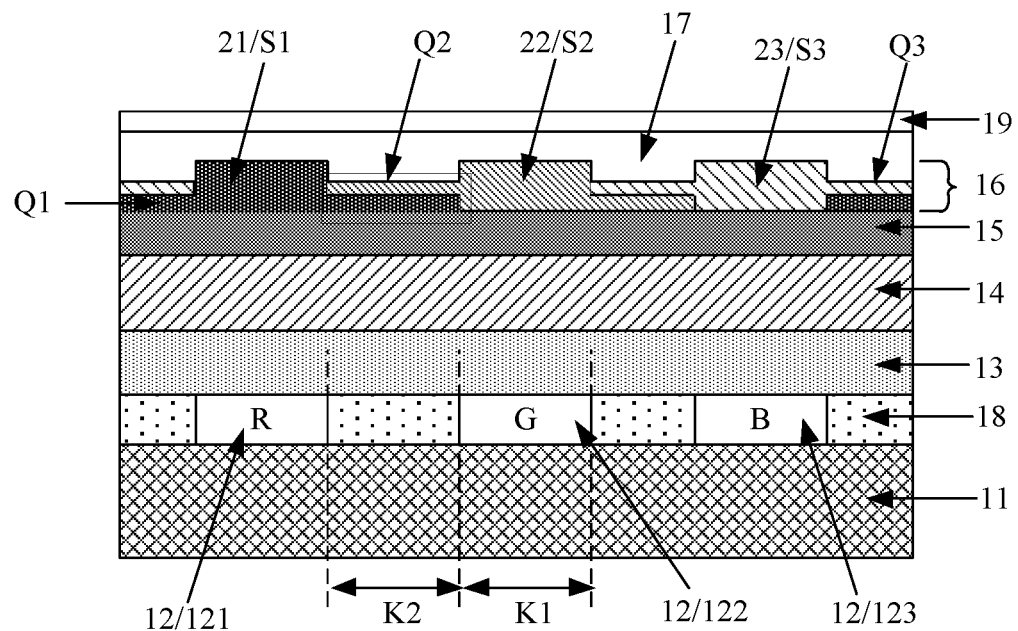
FIG. 16 illustrates a cross-sectional view of each structure after forming a second planarization layer and a cover plate in a forming method of a display panel provided by an embodiment of the present disclosure.

FIG. 16 illustrates a cross-sectional view of each structure after forming a second planarization layer and a cover plate in a forming method of a display panel provided by an embodiment of the present disclosure. In some embodiments, after the color-resist structure 16 is formed on the side of the first planarization layer 15 away from the display array 12, the forming method of the display panel further includes forming the second planarization layer 17 on a side of the color-resist structure 16 away from the array substrate 11 and forming the cover plate 19 on a side of the second planarization layer 17 away from the array substrate 11.

It can be understood that the second planarization layer 17 may be formed after forming the color-resist structure 16 to facilitate bonding and fixing of the cover plate 19.

In the above forming method of the display panel, after the touch layer 14 and the first planarizing layer 15 on a surface of the touch layer 14 are formed, process steps of forming the black matrix in a conventional forming process are cancelled, and each layer of the color-resist layers is directly formed. In areas of the display panel corresponding to the non-opening areas K2, a stacked block structure of different color-resist layers is used to replace the black matrix.

Each color-resist layer can be formed by a coating process and is patterned by using a halftone mask corresponding to a pattern.

Figure 17:
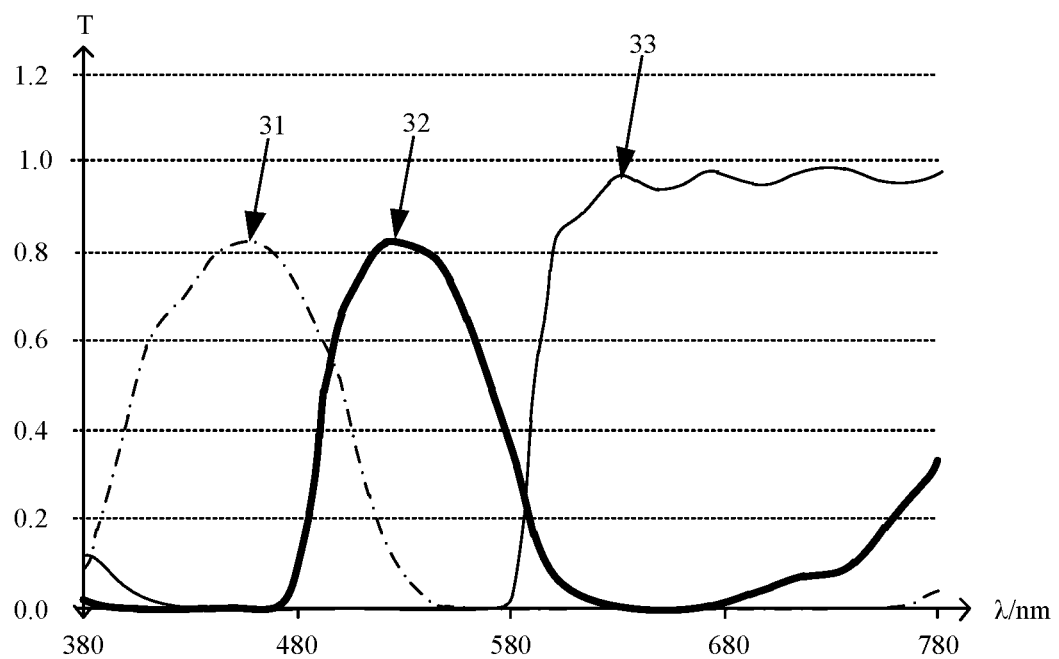
FIG. 17 illustrates transmission curves of different color-resist layers in a visible light band.

FIG. 17 illustrates transmission curves of different color-resist layers in a visible light band. In FIG. 17, a horizontal axis is a wavelength 2, and a vertical axis is a transmittance T. Taking the above first color-resist layer 21 to transmit red light, the second color-resist layer 22 to transmit green light, and the third color-resist layer 23 to transmit blue light as an example, curve 31 is a transmittance curve of the first color-resist layer 21, curve 32 is a transmittance curve of the second color-resist layer 22, and curve 33 is a transmittance curve of the third color-resist layer 23. In a visible light band corresponding to the horizontal axis, for a same coordinate on the horizontal axis, a product of transmittances of any two curves on the vertical axis does not exceed 30%, while a product of transmittances of the three curves on the vertical axis is approximately 0. Therefore, the light-shielding structure formed by stacking blocks of two or three different color-resist layers has a maximum transmittance of no more than 30%, which meets a low transmittance requirement of the black matrix in the display panel and can be multiplexed as the black matrix.

Various embodiments in the present specification are described in a progressive, parallel, or a combination of progressive and parallel manner. Each embodiment focuses on the differences from other embodiments, and same and similar parts of the various embodiments may be referred to each other. As for a device disclosed in one embodiment, since the device corresponds to the method disclosed in the embodiment, the description is relatively simple, and for the related part, please refer to the description of the method part.

It should be noted that in the description of the present disclosure, it should be understood that an orientation or a positional relationship indicated by terms "upper", "lower", "top", "bottom", "inner" and "outer" are based on the orientation or the positional relationship shown in the accompanying drawings, and are only for a convenience of describing the present disclosure and simplifying the description, and does not indicate or imply that the device or element referred to must have a specific orientation, be constructed and operate in a specific orientation, and should not be construed as limiting the present disclosure. When a component is "connected" to another component, which may be directly connected to the other component or there may be a centered component at a same time.

It should also be noted that in the present specification, relational terms such as first, second and the like are only used to distinguish one entity or operation from another entity or operation, and do not necessarily require or imply an actual relationship or order between these entities or operations. Moreover, the term "comprises", "includes" or any other variation thereof is intended to cover a non-exclusive inclusion so that an article or device comprising a series of elements includes not only the elements, but also other elements not expressly listed, or elements inherent to such an article or device. Without further limitations, an element defined by the phrase "comprising a . . . " does not exclude the presence of additional identical elements in an article or device comprising the element.

As disclosed, the display panel, the forming method thereof and the display device provided by the present disclosure at least achieve the following beneficial effects.

The forming method of the display panel can multiplex overlapped blocks in the non-opening areas in different color-resist layers as the light-shielding structure, and the black matrix needs not to be arranged in the display panel, which solves the problem of interlayer warping or even separation caused by different material properties between the black matrix and the planarization layer below the back matrix in an existing display panel, and ensures an image quality and a service life of the display panel.

The above description of the disclosed embodiments is provided to enable a person skilled in the art to make or use the disclosure. Various modifications to the embodiments may be apparent to a person skilled in the art. General principles defined herein may be implemented in other embodiments without departing from the spirit or scope of the present disclosure. Accordingly, the present disclosure will not be limited to the embodiments shown herein but will conform to a widest scope consistent with the principles and novel features disclosed herein.

What is claimed is:

1. A display panel, comprising:
    an array substrate, including a plurality of open areas and non-open areas between adjacent open areas;
    a display array on a side of the array substrate, the display array at least including a first light-emitting element, a second light-emitting element, and a third light-emitting element with different light-emitting colors, and the first light-emitting element, the second light-emitting element and the third light-emitting element being respectively in corresponding opening areas;
    an encapsulation layer covering the display array;
    a touch electrode layer on a side of the encapsulation layer away from the array substrate;
    a first planarization layer covering the touch electrode layer; and
    a color-resist structure on a side of the first planarization layer away from the display array, the color-resist structure including a first color-resist layer, a second color-resist layer and a third color-resist layer, wherein:
        the first color-resist layer includes a first color-resist unit and a first block, in a direction perpendicular to a plane where the array substrate is located, the first color-resist unit at least partially overlaps the first light-emitting element, and the first block at least partially overlaps the non-opening area;
        the second color-resist layer includes a second color-resist unit and a second block, in the direction perpendicular to the plane where the array substrate is located, the second color-resist unit at least partially overlaps the second light-emitting element, and the second block at least partially overlaps the non-opening area;
        the third color-resist layer includes a third color-resist unit and a third block, in the direction perpendicular to the plane where the array substrate is located, the third color-resist unit at least partially overlaps the third light-emitting element, and the third block at least partially overlaps the non-opening area; and
        at least two of the first block, the second block and the third block are stacked along the direction perpendicular to the plane where the array substrate is located to form a light-shielding structure,
    wherein:
        the first color-resist unit is adjacent to the second color-resist unit, and the light-shielding structure includes a second light-shielding structure, and
        the second light-shielding structure is between the first color-resist unit and the second color-resist unit and has a same thickness as the first color-resist unit, and the second light-shielding structure includes the first block and the third block but does not include the second block stacked along the direction perpendicular to the plane where the array substrate is located.

2. The display panel according to claim 1, wherein:
    the first block is integrated with the adjacent first color-resist unit;
    the second block is integrated with the adjacent second color-resist unit; and
    the third block is integrated with the adjacent third color-resist unit.

3. The display panel according to claim 1, wherein:
    the first color-resist unit is adjacent to the second color-resist unit;
    the light-shielding structure includes a first light-shielding structure; and
    the first light-shielding structure is between the first color-resist unit and the second color-resist unit and includes the first block and the second block.

4. The display panel according to claim 1, wherein:
    the first color-resist unit, the second color-resist unit and the third color-resist unit have a same first thickness.

5. The display panel according to claim 4, wherein:
    the shielding structure includes the first block, the second block and the third block; and
    thicknesses of the first block, the second block and the third block are all a third thickness equal to one-third of the first thickness.

6. The display panel according to claim 4, wherein:
    the light-shielding structure includes any two of the first block, the second block, and the third block; and
    thicknesses of the first block, the second block and the third block are all a fourth thickness equal to one-half of the first thickness.

7. The display panel according to claim 1, wherein:
    a pixel definition layer is arranged on the array substrate;
    the pixel definition layer has a plurality of pixel openings, and the first light-emitting element, the second light-emitting element and the third light-emitting element are respectively in corresponding pixel openings; and
    an orthographic projection of the first light-emitting element on the array substrate is in a range of an orthographic projection of the first color-resist unit on the array substrate, an orthographic projection of the second light-emitting element on the array substrate is in a range of an orthographic projection of the second color-resist unit on the array substrate, and an orthographic projection of the third light-emitting element on the array substrate is in a range of an orthographic projection of the third color-resist unit on the array substrate.

8. The display panel according to claim 1, further comprising:
    a second planarization layer covering the color-resist structure; and
    a cover plate on a side of the second planarization layer away from the color-resist structure.

9. The display panel according to claim 1, wherein the encapsulation layer includes a first inorganic layer, a first organic layer and a second inorganic layer which are sequentially stacked along a direction away from the array substrate.

10. The display panel according to claim 1, wherein the touch electrode layer further includes an insulating layer, and the first touch electrode layer, the insulating layer, and the second touch electrode layer that are sequentially stacked along a direction away from the array substrate.

11. A display device comprising a display panel, the display panel comprising:
    an array substrate, including a plurality of open areas and non-open areas between adjacent open areas;

a display array on a side of the array substrate, the display array at least including a first light-emitting element, a second light-emitting element, and a third light-emitting element with different light-emitting colors, and the first light-emitting element, the second light-emitting element and the third light-emitting element being respectively in corresponding opening areas;

an encapsulation layer covering the display array;

a touch electrode layer on a side of the encapsulation layer away from the array substrate;

a first planarization layer covering the touch electrode layer; and a color-resist structure on a side of the first planarization layer away from the display array, the color-resist structure including a first color-resist layer, a second color-resist layer and a third color-resist layer, wherein:

the first color-resist layer includes a first color-resist unit and a first block, in a direction perpendicular to a plane where the array substrate is located, the first color-resist unit at least partially overlaps the first light-emitting element, the first block at least partially overlaps the non-opening area;

the second color-resist layer includes: a second color-resist unit and a second block, in the direction perpendicular to the plane where the array substrate is located, the second color-resist unit at least partially overlaps the second light-emitting element, and the second block at least partially overlaps the non-opening area;

the third color-resist layer includes a third color-resist unit and a third block, in the direction perpendicular to the plane where the array substrate is located, the third color-resist unit at least partially overlaps the third light-emitting element, and the third block at least partially overlaps with the non-opening area; and at least two of the first block, the second block and the third block are stacked along the direction perpendicular to the plane where the array substrate is located to form a light-shielding structure, wherein:

the first color-resist unit is adjacent to the second color-resist unit, and the light-shielding structure includes a second light-shielding structure, and the second light-shielding structure is between the first color-resist unit and the second color-resist unit and has a same thickness as the first color-resist unit, and the second light-shielding structure includes the first block and the third block but does not include the second block stacked along the direction perpendicular to the plane where the array substrate is located.

12. A method of forming a display panel, comprising:

providing an array substrate including a plurality of opening areas and non-opening areas between adjacent opening areas;

forming a display array on a side of the array substrate, the display array at least including a first light-emitting element, a second light-emitting element, and a third light-emitting element with different light-emitting colors, the first light-emitting element, the second light-emitting element, and the third light-emitting element being respectively in corresponding opening areas;

sequentially forming an encapsulation layer covering the display array, a touch electrode layer, and a first planarization layer covering the touch electrode layer on a side of the display array away from the array substrate; and forming a color-resist structure on a side of the first planarization layer away from the display array, the color-resist structure including a first color-resist layer, a second color-resist layer and a third color-resist layer, wherein:

the first color-resist layer includes a first color-resist unit and a first block, in a direction perpendicular to a plane where the array substrate is located, the first color-resist unit at least partially overlaps the first light-emitting element, and the first block at least partially overlaps the non-opening area;

the second color-resist layer includes a second color-resist unit and a second block, in the direction perpendicular to the plane where the array substrate is located, the second color-resist unit at least partially overlaps the second light-emitting element, and the second block at least partially overlaps the non-opening area;

the third color-resist layer includes: a third color-resist unit and a third block, in the direction perpendicular to the plane where the array substrate is located, the third color-resist unit at least partially overlaps the third light-emitting element, and the third block at least partially overlaps the non-opening area; and at least two of the first block, the second block and the third block are stacked along the direction perpendicular to the plane where the array substrate is located to form a light-shielding structure, wherein:

the first color-resist unit is adjacent to the second color-resist unit, and the light-shielding structure includes a second light-shielding structure, and the second light-shielding structure is between the first color-resist unit and the second color-resist unit and has a same thickness as the first color-resist unit, and the second light-shielding structure includes the first block and the third block but does not include the second block stacked along the direction perpendicular to the plane where the array substrate is located.

13. The forming method according to claim 12, wherein:

a thickness of the first color-resist unit is greater than a thickness of the first block, and the first color-resist unit and the first block are formed by one patterning process;

a thickness of the second color-resist unit is greater than a thickness of the second block, and the second color-resist unit and the second block are formed by one patterning process; and a thickness of the third color-resist unit is greater than a thickness of the third block, and the third color-resist unit and the third block are formed by one patterning process.

14. The forming method according to claim 13, wherein forming the color-resist structure on the side of the first planarization layer away from the display array includes:

synchronously forming the first color-resist unit and the first block on a side of the first planarization layer away from the display array based on a halftone mask;

synchronously forming the second color-resist unit and the second block on the side of the first planarization layer away from the display array based on a halftone mask; and synchronously forming the third color-resist unit and the third block on the side of the first planarization layer away from the display array based on a halftone mask, wherein the first block is integrated with the adjacent first color-resist unit; the second block is integrated with the adjacent second color-resist unit; and the third block is integrated with the adjacent third color-resist unit.

* * * * *